(12) United States Patent
Shibata et al.

(10) Patent No.: US 6,841,808 B2
(45) Date of Patent: Jan. 11, 2005

(54) GROUP III NITRIDE COMPOUND SEMICONDUCTOR DEVICE AND METHOD FOR PRODUCING THE SAME

(75) Inventors: Naoki Shibata, Nishikasugai-gun (JP); Toshiaki Chiyo, Nishikasugai-gun (JP); Masanobu Senda, Nishikasugai-gun (JP); Jun Ito, Nishikasugai-gun (JP); Hiroshi Watanabe, Nishikasugai-gun (JP); Shinya Asami, Nishikasugai-gun (JP); Shizuyo Asami, Nishikasugai-gun (JP)

(73) Assignee: Toyoda Gosei Co., Ltd., Aichi (JP)

(*) Notice: Subject to any disclaimer, the term of this patent is extended or adjusted under 35 U.S.C. 154(b) by 0 days.

(21) Appl. No.: 09/885,046

(22) Filed: Jun. 21, 2001

(65) Prior Publication Data

US 2002/0014629 A1 Feb. 7, 2002

(30) Foreign Application Priority Data

Jun. 23, 2000 (JP) .................................. 2000-189391
Jun. 26, 2000 (JP) .................................. 2000-191780

(51) Int. Cl.⁷ ................. H01L 31/0328; H01L 31/0336; H01L 27/15; H01L 31/12; H01L 33/00
(52) U.S. Cl. ........................... 257/190; 257/79; 257/94
(58) Field of Search ................... 257/190, 79, 86, 257/94, 13, 81, 85, 90, 96, 101, 102, 103, 12, 22

(56) References Cited

U.S. PATENT DOCUMENTS 6,015,979 A * 1/2000 Sugiura et al. ............... 257/86
6,194,742 B1 * 2/2001 Kern et al. .................... 257/94
6,325,850 B1 * 12/2001 Beaumont et al. ............ 117/95
6,348,096 B1 * 2/2002 Sunakawa et al. ............ 117/88

FOREIGN PATENT DOCUMENTS

| JP | 07-267796 | 10/1995 |
| JP | 09-199759 | 7/1997 |
| JP | 09-232629 | 9/1997 |
| JP | 10-004210 | 1/1998 |
| JP | 10-135575 | 5/1998 |
| JP | 10-312971 | * 11/1998 |
| JP | 11-191639 | 7/1999 |
| WO | wo99/20816 | * 4/1999 ........... C30B/25/02 |

* cited by examiner

Primary Examiner—Shouxiang Hu
(74) Attorney, Agent, or Firm—McGinn & Gibb, PLLC

(57) ABSTRACT

An AlN layer having a surface of a texture structure is formed on a sapphire substrate. Then, a growth suppressing material layer is formed on the AlN layer so that the AlN layer is partially exposed to the outside. Then, group III nitride compound semiconductor layers are grown on the AlN layer and on the growth suppressing material layer by execution of an epitaxial lateral overgrowth method. Thus, a group III nitride compound semiconductor device is produced. An undercoat layer having convex portions each shaped like a truncated hexagonal pyramid is formed on a substrate. Group III nitride compound semiconductor layers having a device function are laminated successively on the undercoat layer.

18 Claims, 8 Drawing Sheets

GROUP III NITRIDE COMPOUND SEMICONDUCTOR DEVICE AND METHOD FOR PRODUCING THE SAME

BACKGROUND OF THE INVENTION

1. Field of the Invention

The present invention relates to a group III nitride compound semiconductor device and a method for producing thereof. Particularly, it relates to improvement of a producing method using an epitaxial lateral overgrowth method as a method for growing a group III nitride compound semiconductor film.

The present application is based on Japanese Patent Applications Nos. 2000-189391 and 2000-191780, which are incorporated herein by reference.

2. Description of the Related Art

A so-called epitaxial lateral overgrowth method is known as a method for growing a group III nitride compound semiconductor layer. For example, in the epitaxial lateral overgrowth method as introduced in Unexamined Japanese Patent Publication No. Hei. 10-312971, a mask layer of a growth suppressing material such as $SiO_2$ is patterned on an undercoat by a photolithography method and a wet etching method in advance, so that a group III nitride compound semiconductor layer is grown on a window of the mask, that is, on an exposed portion of the undercoat while a facet structure is formed. As a result, a group III nitride compound semiconductor layer little in crystal defect is epitaxially grown by a metal organic chemical vapor deposition method. For example, a group III nitride compound semiconductor layer formed on a substrate through a low-temperature sedimentary layer is used as the undercoat. The low-temperature sedimentary layer is provided to relax distortion due to difference in thermal expansion coefficient and lattice constant between the substrate and the group III nitride compound semiconductor to thereby reduce crystal defects of the group III nitride compound semiconductor layer formed on the undercoat layer.

According to the aforementioned method in which the formation of the low-temperature sedimentary layer, the formation of the group III nitride compound semiconductor layer as the undercoat layer and the formation of the group III nitride compound semiconductor layer by an epitaxial lateral overgrowth method are performed successively, the group III nitride compound semiconductor layer can be grown with good crystallinity surely.

The temperature for growing the group III nitride compound semiconductor layer by a general metal organic chemical vapor deposition method (hereinafter referred to as "MOCVD" method) is, however, 1000° C. or higher. On the other hand, the growth temperature of the low-temperature sedimentary layer is approximately in a range of from 400° C. to 500° C. Hence, from cleaning the substrate to forming the undercoat layer (group III nitride compound semiconductor layer), the temperature of the substrate changes into high temperature (1000° C.: cleaning of the substrate), low temperature (500° C.: formation of the low-temperature sedimentary layer) and high temperature (1000° C.: formation of the undercoat layer). It is necessary to repeat increase and decrease of the substrate temperature largely. It is therefore, a matter of course that a long time is required for production. Moreover, it is necessary to adjust the substrate temperature in each step. In addition, it is undesirable from the point of view of thermal efficiency.

Therefore, it maybe conceived that the sedimentary layer is formed at a high temperature. However, a bowing problem hereinafter described occurs if the group III nitride compound semiconductor layer (for example, an AlN layer the same as the low-temperature sedimentary layer) is directly grown on the substrate at a high temperature of about 1000° C.

For example, in a light-emitting device having a configuration in which a group III nitride compound semiconductor layer having a device function is epitaxially grown on a surface of a sapphire substrate, distortion occurs between the sapphire substrate and the group III nitride compound semiconductor layer because the thermal expansion coefficient and lattice constant of the sapphire substrate are different from those of the group III nitride compound semiconductor layer. The distortion causes a phenomenon that the laminate of the sapphire substrate and the group III nitride compound semiconductor layer is bowed. If the bowing is too large, there is a disadvantage in alignment control at the time of the production of the device as well as there is a risk that the crystallinity of semiconductor may deteriorate or the semiconductor layer may crack.

The inventors of the present invention have made researches to solve the aforementioned bowing problem. As a result, the inventors have proposed an invention configured as follows:

A group III nitride compound semiconductor device comprising: a group III nitride compound semiconductor layer having a device function; and an undercoat layer having a surface on which the group III nitride compound semiconductor layer can be formed; wherein slopes are formed in the surface of the undercoat layer so that the ratio of the area occupied by the slopes to the surface of the undercoat layer is in a range of from 5 to 100% on a plane of projection.

Further, from another point of view, the undercoat layer is formed as a texture structure. The texture structure used herein means a structure in which the surface of the undercoat layer is shaped like teeth of a saw when any section thereof is viewed, that is, peaks and troughs are repeated through the slopes. The peak portions may contain peak portions shaped like independent polygonal pyramids (inclusive of cones) or peak portions connected like a mountain range.

Further, the trapezoid shape in section used in the above-mentioned invention means a shape in which a flat region on the top of each of the peak portions has a large area. The pit shape used in the above-mentioned invention means a shape in which the flat region has a further larger area.

In the above-mentioned invention, the texture structure shows the case where the ratio of the slope regions to a plane of projection is in a range of from 70 to 100%; the trapezoid shape in section shows the case where the ratio is in a range of from 30 to 70%; and the pit shape shows the case where the ratio is in a range of from 5 to 30%.

When the aforementioned undercoat layer is used, distortion between the group III nitride compound semiconductor layer and the substrate inclusive of the undercoat layer can be relaxed. It is conceived that stress applied on a hetero interface is diffused in parallel to the slopes because of the presence of the slopes in the hetero interface and, accordingly, the stress is relaxed. When distortion is relaxed in the aforementioned manner, the bowing problem is reduced. As a result, the group III nitride compound semiconductor layer can be prevented from cracking. Moreover, the crystallinity of the group III nitride compound semiconductor layer can be improved. In addition, the group III nitride compound layer can be aligned easily when the device is produced.

The inventors of the present invention further made researches upon the undercoat layer having the aforementioned surface structure. As a result, the inventors have found the following problem.

In the embodiment of the proposed invention, examination has been made upon the case where AlN was exclusively selected as the material of the undercoat layer. When an undercoat layer having a texture structure or the like was to be formed from AlN by an MOCVD method, it was necessary to make the inside pressure of the reactor lower than that in the case where group III nitride compound semiconductor layers were grown. Specifically, the inside pressure of the reactor was preferably selected to be in a range of from 50 to 300 Pa, when the undercoat layer was formed, whereas the inside pressure of the reactor was of 1 atmosphere when the group III nitride compound semiconductor layer (generally, an n-type contact layer of n-type GaN) formed on the undercoat layer was grown.

If there was a pressure variation in the film-forming process as described above, an interface before and after the pressure variation was apt to be roughened and it was necessary to control the condition severely to smoothen the interface. Moreover, the film-forming apparatus needed to have a mechanism to make the pressure variation possible. As a result, the size and cost of the film-forming apparatus became large and high. This caused increase of the production cost of the device.

SUMMARY OF THE INVENTION

The present invention is designed to solve the problem. An object of the present invention is to form a sectionally trapezoidal undercoat layer in the substantially same producing condition (pressure condition) as that for group III nitride compound semiconductor layers having a device function, and more specifically, it is to form an undercoat layer having a surface with convex portions each shaped like a truncated hexagonal pyramid.

Another object of the present invention is to provide a group III nitride compound semiconductor device having a novel configuration, especially having an undercoat layer of a novel configuration.

The present invention is designed to achieve at least one of the foregoing objects and the configuration thereof is as follows.

A group III nitride compound semiconductor device comprises: a substrate; an undercoat layer formed on the substrate and having a surface with convex portions each shaped like a truncated hexagonal pyramid; and group III nitride compound semiconductor layers formed successively on the undercoat layer and having a device function.

According to the group III nitride compound semiconductor device configured as described above, the surface is constituted by convex portions each shaped like a truncated hexagonal pyramid, so that distortion between the group III nitride compound semiconductor layers and the substrate inclusive of the undercoat layer is relaxed. This is conceived to be due to the fact as follows. The stress applied to the hetero interface between the group III nitride compound semiconductor layers and the undercoat layer is distributed and relaxed because the stress is made parallel to inclined surfaces (that is, slopes of the truncated hexagonal pyramids) by the presence of the inclined surfaces. When distortion is relaxed in this manner, the problem of bowing is reduced. As a result, the group III nitride compound semiconductor layers can be prevented from cracking. Moreover, crystallinity of the group III nitride compound semiconductor layers is improved. In addition, alignment can be made easily at the time of the production of the device.

Further, the inventors of the present invention have made examination in consideration of the aforementioned problem, resulting in a conception of the present invention configured as follows.

That is, a method for producing a group III nitride compound semiconductor device, comprises:

forming an undercoat layer on a substrate so that the undercoat layer has a surface of a texture structure;

forming a growth suppressing material layer on the undercoat layer so that the undercoat layer is partially exposed; and growing group III nitride compound semiconductor layers on the undercoat layer and on the growth suppressing material layer by performing an epitaxial lateral overgrowth method.

In the producing method configured as described above, a low-temperature sedimentary layer is not formed in the same manner as that in the background art, but an undercoat layer having a surface of a texture structure is formed and then a group III nitride compound semiconductor layer is grown on the undercoat layer. Hence, the growth of the group III nitride compound semiconductor layer as the next step can be performed without reduction of the substrate temperature required in the background art for growing the low-temperature sedimentary layer after cleaning of the substrate. In other words, in a process of from the step of cleaning the substrate to the step of growing a set of group III nitride compound semiconductor layers having a device function, the number of times for increasing and decreasing the substrate temperature can be reduced to thereby attain reduction of the production time. Moreover, the labor required for adjusting the temperature can be reduced.

Features and advantages of the invention will be evident from the following detailed description of the preferred embodiments described in conjunction with the attached drawings.

DETAILED DESCRIPTION OF THE PREFERRED EMBODIMENTS

Figure 1:
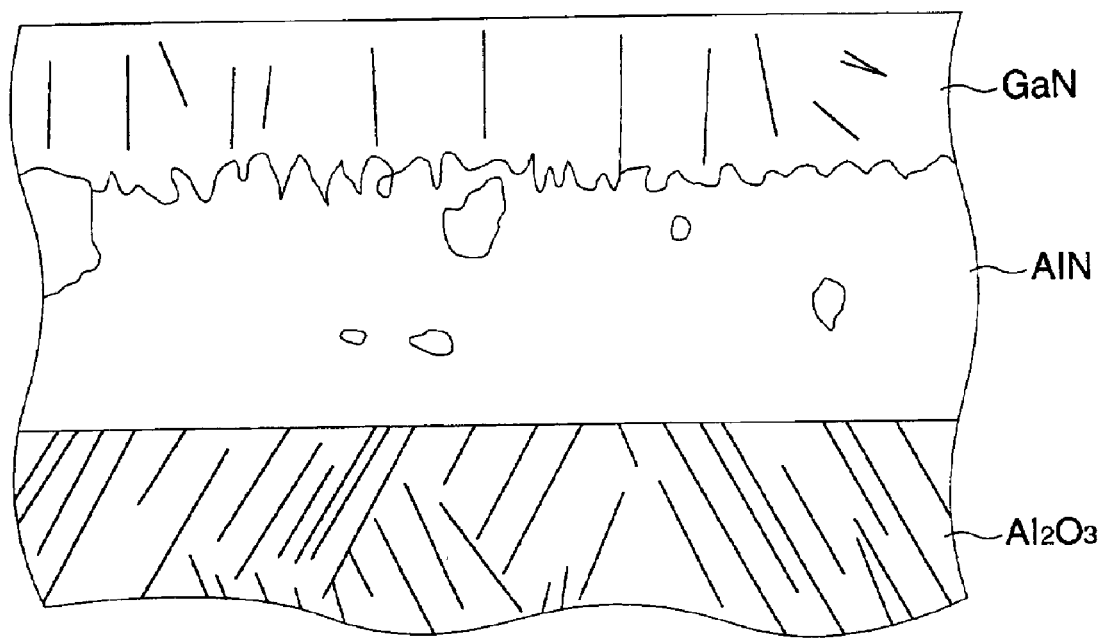
FIG. 1 shows a sectional view showing an undercoat layer having a texture structure.

The detailed description of the present invention will be described hereinafter.

The material of the substrate is not particularly limited so long as an undercoat layer can be formed on the substrate. Examples of the substrate material used in the case where the undercoat layer made of the group III nitride compound semiconductor is used may include: hcp (hexagonal closed packing) structure materials such as sapphire, SiC (silicon carbide), GaN (gallium nitride), etc.; and cubic-system materials such as Si (silicon), GaP (gallium phosphide), GaAs (gallium arsenide), etc. Further, examples such as spinel, zinc oxide, magnesium oxide, manganese oxide, group III nitride compound semiconductor single crystal, etc. may be used.

The undercoat layer having a surface of a texture structure is formed on the substrate. The texture structure used herein means a structure in which the surface of the undercoat layer is shaped like teeth of a saw when any section thereof is viewed, that is, peaks and troughs are repeated through inclined surfaces. The peak portions may contain peak portions shaped like independent polygonal pyramids (inclusive of cones) and peak portions connected like a mountain range. The sectionally trapezoid shape used in this specification means a shape in which a flat region on the top of each of the peaks has a large area. The pit shape used in this specification means a shape in which the flat region has a further larger area. Specifically, the case where the percentage occupied by the slope regions on a plane of projection is in a range of from 70 to 100% is called texture structure. The case where the percentage is in a range of from 30 to 70% is called sectionally trapezoid shape. The case where the percentage is in a range of from 5 to 30% is called pit shape.

The undercoat layer is not particularly limited so long as a group III nitride compound semiconductor can be grown on the undercoat layer. The undercoat layer is preferably made of a group III nitride compound semiconductor. It is especially preferable to employ an undercoat layer of AlN.

When an undercoat layer made of a group III nitride compound semiconductor is used, the group III nitride compound semiconductor includes a quarternary compound semiconductor represented by $Al_XGa_YIn_{1-X-Y}N$ ($0<X<1$, $0<Y<1$, $0<X+Y<1$), a ternary compound semiconductor represented by $Al_XGa_{1-X}N$ ($0<X<1$) and a binary compound semiconductor such as AlN, GaN and InN. When a sapphire substrate is used, AlN is especially preferably used as the group III nitride compound semiconductor formed on the sapphire substrate.

Slopes are formed in a surface of the undercoat layer. On this occasion, the original structure for forming the slopes may contain a set of polygonal pyramids such as triangular pyramids, rectangular pyramids, etc. or may contain a mountain range structure with peak portions and trough portions connected to one another by belt-like inclined faces. The slopes are formed over the whole surface of the undercoat layer. Each of the slopes is so small that its width on a plane of projection is smaller than 2 $\mu$m The percentage of the area occupied by the slopes (which are concave portions from another point of view) on the plane of projection is selected to be preferably in a range of from 5 to 100%, especially preferably in a range of from 30 to 100%, more especially preferably in a range of from 70 to 100%.

Figure 2:
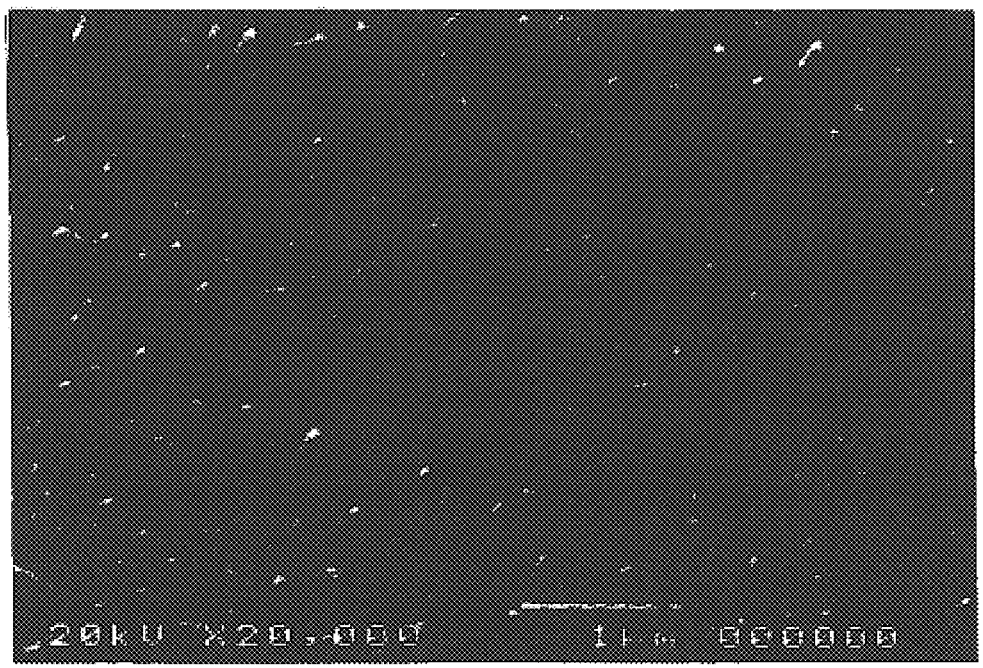
FIG. 2 shows an SEM photograph showing an undercoat layer having a texture structure.

When the percentage of the area occupied by the slopes on the plane of projection is in a range of from 70 to 100%, the surface of the undercoat layer exhibits a texture structure with a sectional shape of peaks as shown in FIGS. 1 and 2. When the percentage is 100%, the surface is formed as a structure in which peaks and troughs are repeated like teeth of a saw.

Figure 3:
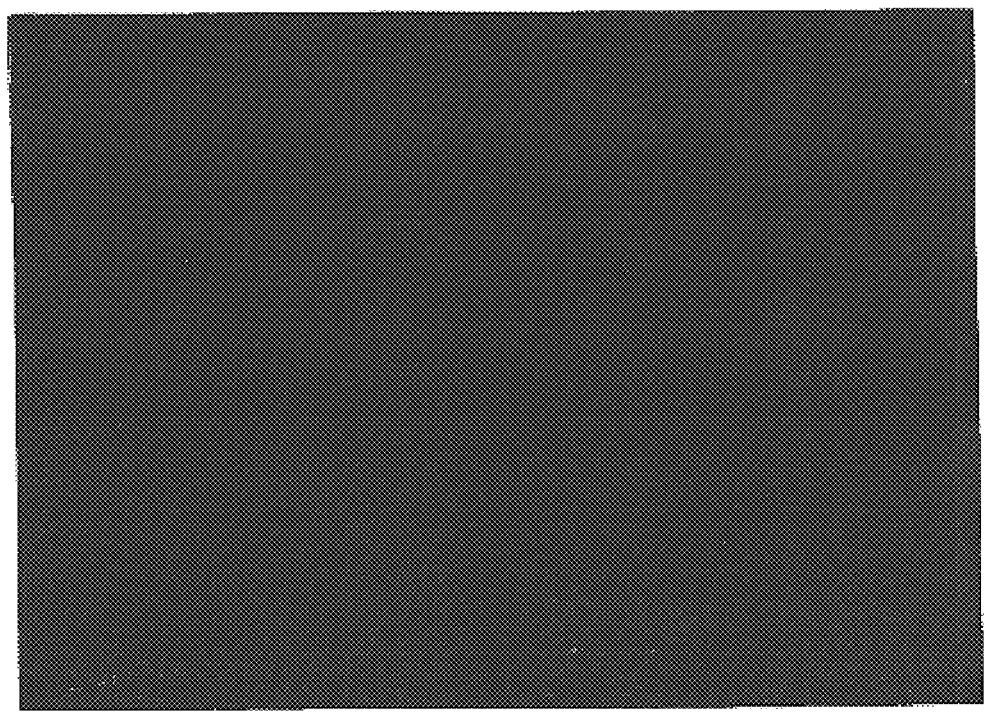
FIG. 3 shows an SEM photograph showing an undercoat layer having a trapezoid shape in section.

When the percentage of the area occupied by the slopes on the plane of projection is in a range of from 30 to 70%, the surface of the undercoat layer exhibits a sectionally trapezoid shape in which island portions coexist with peak portions as shown in FIG. 3.

Figure 4:
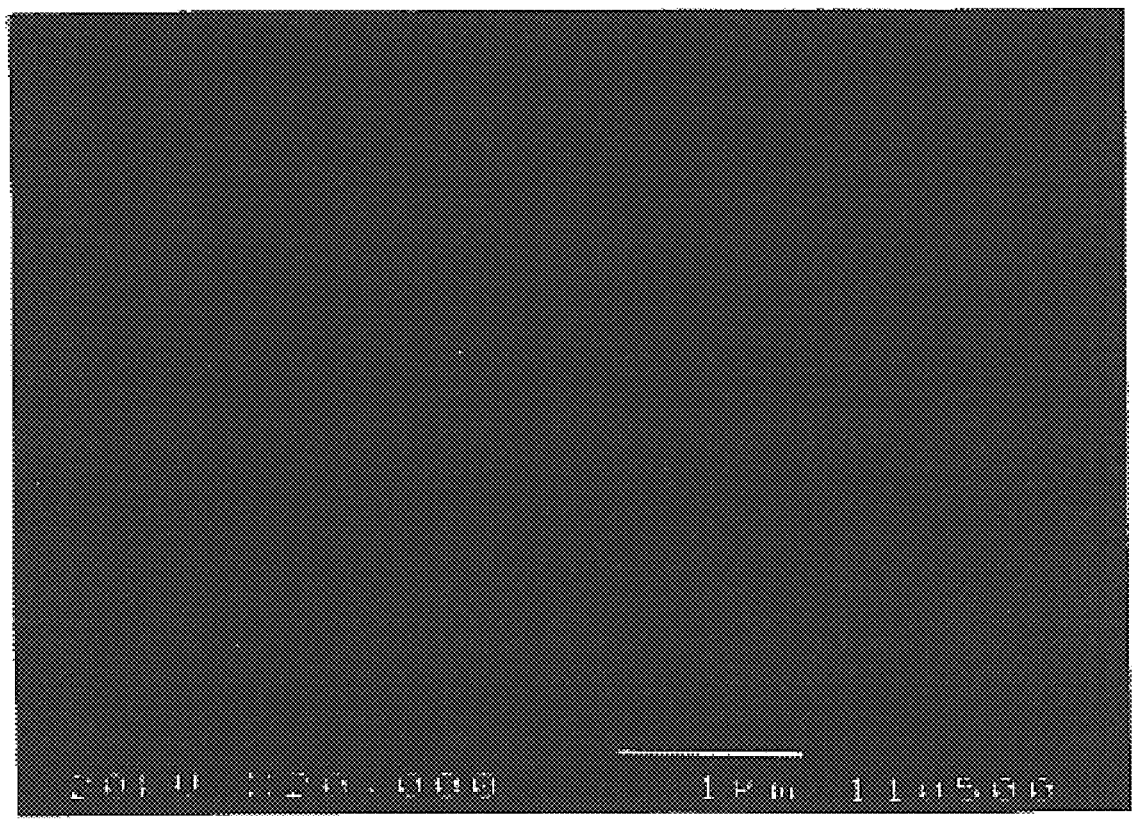
FIG. 4 shows an SEM photograph showing an undercoat layer having a pit shape.

When the percentage of the area occupied by the slopes on the plane of projection is in a range of from 5 to 30%, the surface of the undercoat layer exhibits a pit shape in which holes are formed in a flat surface as shown in FIG. 4.

The plane of projection used herein means a plane of projection obtained by parallel projection of the surface of the undercoat layer onto a plane parallel to the surface of the undercoat layer.

The method for producing the undercoat layer with such a rough surface is not particularly limited. In an embodiment which will be described later, the undercoat layer can be formed by execution of an MOCVD method while pouring a greater amount of ammonia, compared with the usual growth condition, at a high temperature (of about 1150° C.) which is substantially equal to that for the growth of device-function-including group III nitride compound semiconductor layers to be formed on the undercoat layer.

The surface of the undercoat layer may be formed as a texture structure, a sectionally trapezoid shape or a pit shape by means of growing an undercoat layer with a flat surface and then treating the flat surface by a method such as etching. On the other hand, an undercoat layer having convex portions each shaped like a truncated hexagonal pyramid which is one form of the sectionally trapezoid shape is formed as follows. That is, when GaN is used as the material of the undercoat layer and doped with magnesium (Mg) densely, an undercoat layer having convex portions each shaped like a truncated hexagonal pyramid is formed by an MOCVD method. The doping quantity of Mg is preferably selected to be not smaller than $10^{20}/cm^3$. If the doping quantity of Mg is smaller than $10^{20}/cm^3$, it is impossible to generate any convex portion shaped like a truncated hexagonal pyramid or it is necessary to control the condition severely even if such convex portions can be generated when GaN is grown. The doping quantity of Mg is especially preferably $3\times10^{20}/cm^3$, more especially preferably $5\times10^{20}/cm^3$, still more especially preferably $10^{21}/cm^3$, most especially preferably $5\times10^{21}/cm^3$. These convex portions can be also formed by a method such as etching.

An organometallic compound represented by the general formula $CP_2Mg$ (CP representing $RC_5H_4$ in which R represents hydrogen or a lower alkyl group containing 1 to 4 carbon atoms) is preferably used as the raw material of the Mg dopant because the organometallic compound has a suitable vapor pressure. Examples of the organometallic compound may include bis-cyclopentadienyl magnesium, bis-methylcyclopentadienyl magnesium, bis-ethylcyclopentadienyl magnesium, bis-n-propylcyclopentadienyl magnesium, bis-i-propylcyclopentadienyl magnesium, etc.

The group III element (Ga) in GaN which is the material of the undercoat layer may be partially replaced by aluminum (Al), indium (In), boron (B), thallium (Tl), etc., and the nitrogen (N) in the GaN may be partially replaced by phosphorus (P), arsenic (As), antimony (Sb), bismuth (Bi), etc. so long as the replacement does not disturb the formation of truncated-hexagonal-pyramid-shaped convex portions.

When the n-type dopant having a higher density than the hole density constituted by Mg is added, the undercoat layer can be provided as an n type. When an electrically conductive substrate such as a silicon (111) substrate is used, it is preferable that the undercoat layer is made to have electrical conductivity.

Although the growth temperature of the undercoat layer is not particularly limited, it is preferable from the point of view of easy control of the producing condition that the growth temperature of the undercoat layer is selected to be substantially equal to that of the group III nitride compound semiconductor layers.

When group III nitride compound semiconductor layers are grown on the undercoat layer having truncated-hexagonal-pyramid-shaped convex portions, a flat surface is obtained as the surface of the group III nitride compound semiconductor layers if the group III nitride compound semiconductor layers (preferably, the first one of the layers on the undercoat layer) have a thickness in a range of from 1 to 2 μm because the epitaxial lateral overgrowth rate of the group III nitride compound semiconductor layers is secured sufficiently (see Unexamined Japanese Patent Publication No. Hei. 10-312971).

The inventors of the present invention have already made examination of the effect in the case where AlN of a surface texture structure is formed as an undercoat layer on a sapphire substrate. In the examination, there has been obtained a result that the degree of substrate bowing in a laminate obtained by growing AlN of a surface texture structure 1.5 μm thick on a sapphire substrate at a high temperature (1130° C.) is approximately equal to that in the background art (in which an AlN layer is grown on a sapphire substrate at a low temperature of 400° C.). There has been further obtained knowledge that variation in the substrate bowing is also reduced.

It has been further confirmed that group III nitride compound semiconductor layers with crystallinity sufficient to have a device function can be grown on the AlN layer having such a surface texture structure.

A sedimentary layer is preferably formed between the substrate and the undercoat layer.

When the undercoat layer is made of a group III nitride compound semiconductor, it is preferable that the sedimentary layer is made of a group III nitride compound semiconductor similarly or a metal nitride compound semiconductor. Among the group III nitride compound semiconductors, $Al_xGa_{1-x}N$ ($0 \leq x \leq 1$) is preferably used as the sedimentary layer. Especially, AlN is preferably used as the sedimentary layer. Among the metal nitride compound semiconductors, at least one member selected from the group consisting of titanium nitride, hafnium nitride, zirconium nitride and tantalum nitride may be preferably used as the sedimentary layer. Especially, titanium nitride is preferably used as the sedimentary layer. In this case, the substrate is preferably made of sapphire. Especially, the sedimentary layer is preferably formed on a surface a of the sapphire substrate.

A known method for forming a group III nitride compound semiconductor or a metal nitride compound semiconductor, such as an MOCVD method, a sputtering method, or the like, may be used as the method for forming the aforementioned sedimentary layer.

The thickness of the sedimentary layer is not particularly limited but is preferably selected to be in a range of from the order of nm to the order of hundreds of nm (from the order of tens of Å to the order of thousands of Å).

According to the inventors' research, the slopes in the surface of the undercoat layer can be controlled easily when the sedimentary layer is interposed between the substrate and the undercoat layer (distortion relaxation layer). That is, the condition for forming a surface with a desired structure (such as a texture structure, a sectionally trapezoid shape or a pit structure, truncated-hexagonal-pyramid-shape) can be widened so that the surface with the desired structure can be formed easily. Hence, a device having such an undercoat layer can be produced with good yield.

Two or more layers may be provided as the sedimentary layer.

An intermediate layer made of a group III nitride compound semiconductor, preferably made of AlN or GaN, is formed on a first sedimentary layer formed on the substrate. A second sedimentary layer is formed on the intermediate layer. (This operation may be repeated.) An undercoat layer is formed on the second sedimentary layer.

The first sedimentary layer and the second sedimentary layer may be formed as the same composition or as different compositions.

The thickness of the intermediate layer is not particularly limited.

With respect to an example in which a plurality of sedimentary layers are formed, see Unexamined Japanese Patent Publications, Nos. Hei. 7-267796 and 9-199759.

A growth suppressing material layer may be formed on the undercoat layer optionally so that the undercoat layer is partially exposed to the outside. That is, the growth suppressing material layer is formed to cover a part of the surface of the undercoat layer. The growth suppressing material layer is preferably formed on trough regions (concave regions) each formed by adjacent slopes of the undercoat layer surface. In this case, peak regions (convex regions) of the undercoat layer surface are exposed.

The growth suppressing material used herein means a material on which a group III nitride compound semiconductor can be hardly epitaxially grown compared with the same grown on the substrate or on a buffer layer. As the growth suppressing material, there can be used at least one member selected from the group consisting of metals such as Fe, Co, Ni, Cr, Mo, W, Ag and Rh, oxides metals such as oxides of Fe, Co, Ni, Cr, Mo, W, Ag and Rh, oxides such as $Si^OxO$, and nitrides such as $SiN_x$. In Unexamined Japanese Patent Publication No. Hei. 10-312971, $SiO_2$ and $SiN_x$ have been described as examples of the growth suppressing material. The Extended Abstracts of the 60th Autumn Meeting of the Japan Society of Applied Physics (1999.9) 2P-W-5 has described that tungsten (W) can be used as a growth suppressing material. When such a metal material is used as a growth suppressing material on a substrate of a light-emitting diode, the metal material serves as a reflection layer so that light emitted from a light-emitting layer can be used effectively.

The growth suppressing material layer formed to make the undercoat layer partially exposed to the outside can be formed by the following method, for example, using a liquid resist material (such as liquid $SiO_2$).

First, a liquid resist material is used as the growth suppressing material so that a growth suppressing material layer is formed over the whole surface of the rough undercoat layer by means of application, or the like. The liquid resist material forms a thick layer on the surface corresponding to trough regions (concave regions) of the undercoat layer and forms a thin layer (growth suppressing material layer) on the surface corresponding to peak regions (convex regions) of the undercoat layer due to the surface tension of the resist material. The liquid growth suppressing material layer is solidified and then etched from its surface. By this etching step, the growth suppressing material layer is removed uniformly from its surface, so that peak regions of the undercoat layer are first exposed. When the etching step is finished in this state, the growth suppressing material layer can be left only in trough regions of the undercoat layer. Thus, the growth suppressing material layer can be formed only in the trough regions of the undercoat layer.

Alternatively, the liquid resist material applied onto the regions other than the trough regions may be removed by centrifugal force due to rotation of a wafer after even application of the liquid resist material onto the undercoat layer. Alternatively, the resist layer may be selectively formed in the trough regions of the undercoat layer by control of the amount of the resist material to be applied onto the undercoat layer surface per unit area.

After the growth suppressing material layer is formed on a part of the undercoat layer surface in the aforementioned manner, group III nitride compound semiconductor layers are grown.

The group III nitride compound semiconductors herein used are represented by the general formula $Al_XGa_YIn_{1-X-Y}N$ ($0 \leq X \leq 1$, $0 \leq Y \leq 1$, $0 \leq X+Y \leq 1$), which includes so-called binary compounds such as AlN, GaN and InN, and so-called ternary compounds such as $Al_XGa_{1-X}N$, $Al_XIn_{1-X}N$ and $Ga_XIn_{1-X}N$ ($0 \leq X \leq 1$). The group III element may be partially replaced by boron (B), thallium (Tl), etc. The nitrogen (N) may be partially replaced by phosphorus (P), arsenic (As), antimony (Sb), bismuth (Bi), etc.

Each of the group III nitride compound semiconductor layers may contain any optional dopant. Si, Ge, Se, Te, C, etc. may be used as n-type impurities. Mg, Zn, Be, Ca, Sr, Ba, etc. maybe used as p-type impurities. Incidentally, after doped with p-type impurities, the group III nitride compound semiconductor may be heated by electron beam irradiation, by plasma irradiation or by a furnace in order to reduce the resistance of the group III nitride compound semiconductor more greatly.

The method for forming the group III nitride compound semiconductor layer is not particularly limited. The group III nitride compound semiconductor layer may be formed by a metal organic chemical vapor deposition method (MOCVD method) or may be formed by a known method such as a molecular beam epitaxial growth method (MBE method), a halide vapor phase epitaxial growth method (HVPE method), a sputtering method, an ion-plating method, etc.

When the group III nitride compound semiconductor layer is epitaxially grown by execution of the aforementioned method after the growth suppressing material layer is formed on a part of the undercoat layer surface, the group III nitride compound semiconductor layer is not grown, or is slowly grown even if it is grown, on the growth suppressing material layer in an initial stage but rapid crystal growth occurs on the exposed portions (growth regions) of the undercoat layer. Thus, a facet structure is formed. When epitaxial growth is further performed, growth advances in a direction perpendicular to the surface of the facet structure so that the growth suppressing material layer is covered with the group III nitride compound semiconductor. The group III nitride compound semiconductor comes into contact with the group III nitride compound semiconductor grown on adjacent growth regions. When epitaxial growth is further performed, the facet structure is buried so that the group III nitride compound semiconductor layer with a flat surface is obtained finally.

When such an epitaxial lateral overgrowth method is executed, displacement caused by lattice defects of the group III nitride compound semiconductor generated in the interface between the substrate and the group III nitride compound semiconductor is bent laterally because of the facet structure. As a result, the lattice defects of the group III nitride compound semiconductor layer surface can be reduced greatly.

In this manner, according to the present invention, the effect produced by the epitaxial lateral overgrowth (ELO) method can be obtained.

Incidentally, a reflection layer may be formed between the a group III nitride compound semiconductor layer and the undercoat layer. As the material for forming the reflection layer, at least one member may be selected from the group consisting of titanium nitride, hafnium nitride, zirconium nitride and tantalum nitride. Especially, titanium nitride is preferably used. The method for growing the metal nitride is not particularly limited but examples of the available method include: CVD (Chemical Vapor Deposition) such as plasma CVD, thermal CVD, optical CVD, or the like; PVD (Physical Vapor Deposition) such as sputtering, reactive sputtering, laser ablation, ion plating, evaporation, ECR plasma, or the like; and so on.

The thickness of the reflection layer is preferably selected to be in a range of from 0.1 to 5.0 $\mu$m. If the thickness of the reflection layer is larger than the upper limit, there is a risk that the roughness of the surface of the undercoat layer is lost so that the surface of the reflection layer is flattened. As a result, it becomes impossible to expect relaxation of stress on the hetero interface between the reflection surface and the group III nitride compound semiconductor layer. If the thickness is smaller than the lower limit, reflection of light becomes insufficient. Especially, the thickness of the reflection layer is preferably selected to be in a range of from 0.1 to 1.0 $\mu$m. More especially, the thickness of the reflection layer is preferably selected to be in a range of from 0.2 to 0.5 $\mu$m.

The above case has been described upon the assumption that a group III nitride compound semiconductor layer is grown on the undercoat layer having convex portions each shaped like a truncated hexagonal pyramid so that the group III nitride compound semiconductor layer is directly used as a device function layer. Incidentally, the group III nitride compound semiconductor layer may be formed as an intermediate layer so that a second undercoat layer with the convex portion similarly for relaxation of distortion is formed on the surface of the intermediate layer (this operation may be further repeated) As a result, distortion of the group III nitride compound semiconductor layer with the device function can be relaxed more greatly, so that the crystallinity of the group III nitride compound semiconductor layer is improved more greatly.

The intermediate layer may have a surface having convex portions reflecting the surface structure of the undercoat layer or may have a flat surface.

Embodiments of the present invention will be described below.

Figure 5:
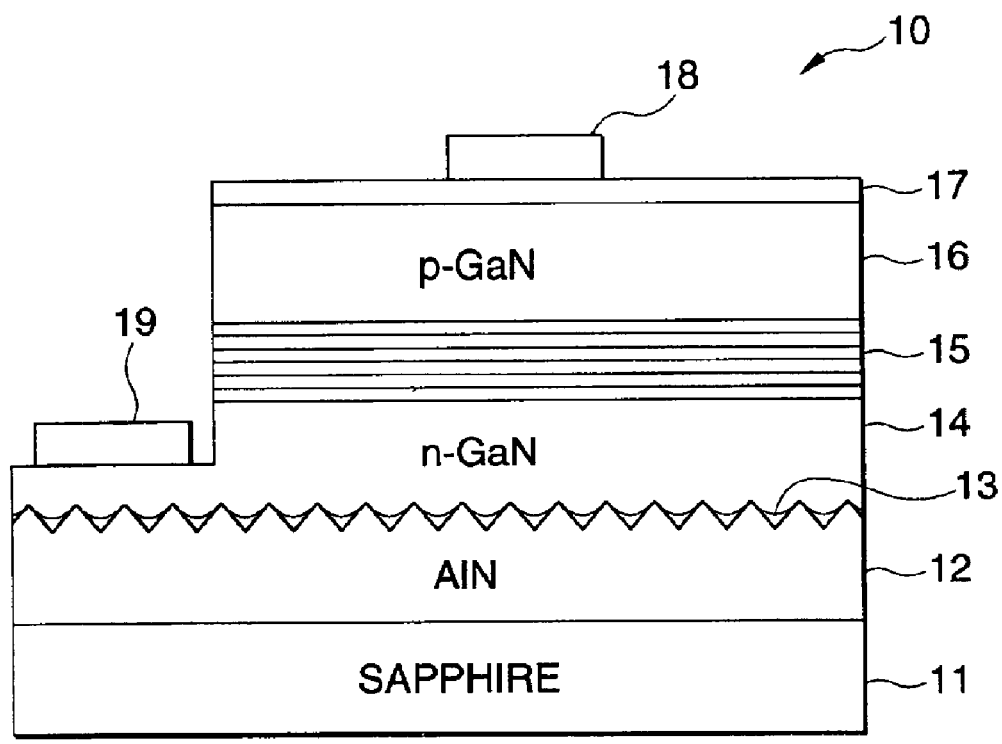
FIG. 5 shows a sectional view of a light-emitting diode according to a first embodiment of the present invention.

FIG. 5 shows the structure of the light-emitting diode 10 according to a first embodiment.

| Layer | Composition: Dopant |
|---|---|
| Light-transmissible electrode layer 17 | |
| p-type layer 16 | p-GaN: Mg |

-continued

| | |
|---|---|
| Layer 15 including a light emitting layer n-type layer 14 | including InGaN layer n-GaN: Si |
| Growth suppressing material layer 13 | $SiO_2$ |
| Undercoat layer 12 | AlN |
| Substrate 11 | sapphire (surface a) |

The n-type layer 14 may be of a double-layered structure with an $n^-$ layer of low electron density on the layer 15 side and an $n^+$ layer of high electron density on the undercoat layer 12 side. The latter is called n-type contact layer.

The layer 15 is not limited to the multiple quantum well structure. A single hetero type structure, a double hetero type structure, a homo-junction type structure, or the like, may be used as the configuration of the light-emitting device.

A group III nitride compound semiconductor layer doped with an acceptor such as magnesium and having a wide band gap may be interposed between the layer 15 and the p-type layer 16. This is a technique for preventing electrons imported into the layer 15 from diffusing into the p-type layer 16.

The p-type layer 16 may be of a double-layered structure with a $p^-$ layer of low hole density on the layer 15 side and $ap^{30}$ layer of high hole density on the electrode side. The latter is called p-type contact layer.

The quantum well layer may be made of InGaAlN, inclusive of InN, GaN, InGaN and InAlN. The barrier layer may made of InGaAlN, inclusive of GaN, InGaN, InAlN, and AlGaN, with an energy gap larger than that of the quantum well layer.

The light-emitting diode 10 configured as described above is produced as follows.

First, while a hydrogen gas is circulated in a reactor of an MOCVD apparatus, the sapphire substrate 11 is heated to 1150° C. to thereby clean the surface of the sapphire substrate 11.

Then, while TMA and $NH_3$ are introduced, an undercoat layer 12 of AlN is grown on the substrate 11 at the substrate temperature by an MOCVD method. On this occasion, when the undercoat layer 12 of AlN is grown as a film with a predetermined thickness while TMA and $NH_3$ are introduced in the condition that TMA:30 µmol/min and $NH_3$: 3 SLM, the surface of the AlN undercoat layer 12 exhibits a texture structure as shown in FIGS. 1 and 2.

Similarly, when the flow rate of $NH_3$ is selected to be in a range of from ½ to ⅓ on the aforementioned condition, the surface of the undercoat layer 12 is made to be a trapezoid shape in section as shown in FIG. 3.

Similarly, when the flow rate of $NH_3$ is selected to be in a range of from ¼ to ⅕ on the aforementioned condition, the surface of the undercoat layer 12 is made to be a pit shape as shown in FIG. 4.

In comparison between the growth rate of AlN in the c-axis direction (direction perpendicular to the substrate) and the growth rate of AlN in the direction perpendicular to the c-axis direction (direction parallel to the substrate) on the condition for forming a flat AlN film on sapphire, particularly in the initial stage of the formation of the AlN film, the latter growth rate is sufficiently larger than the former growth rate. Hence, after grown two-dimensionally in the direction parallel to the substrate, AlN is grown three-dimensionally in the direction perpendicular to the substrate. That is, a sufficient time is required for forming a uniform growth site owing to migration of Al atoms and N atoms on the growth surface.

When the quantity of N is increased against the condition, particularly Al atoms are bonded to atoms on the growth surface before suitable migration so that the growth rate in the direction perpendicular to the substrate is made high. As a result, the growth in the direction parallel to the substrate becomes uneven so that a texture structure can be produced. It may be said that an intermediate process for forming the texture structure is a trapezoid shape in section or a pit shape.

Incidentally, if the quantity of N is increased more greatly, grain growth is obtained so that AlN is not monocrystallized.

At a point of time when the undercoat layer 12 of the surface texture structure is formed on the sapphire substrate 11, the substrate 11 with the undercoat layer 12 is once taken out from the MOCVD apparatus and the growth suppressing material layer 13 is formed as follows (see FIGS. 6A to 6E).

Figure 6A:
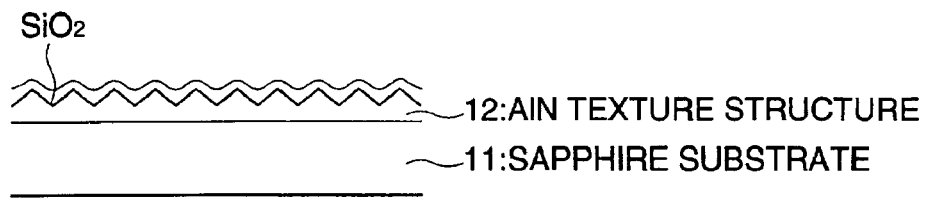
FIGS. 6A to 6E show a process of producing the light-emitting diode according to the first embodiment.
Figure 6B:
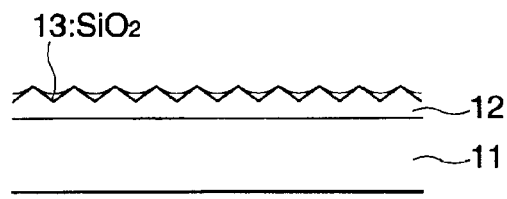

First, after silicone oil is applied onto the surface of the undercoat layer 12 evenly, the silicone oil is heated in an oxygen atmosphere to produce an $SiO_2$ film (FIG. 6A). Then, etching is performed with hydrofluoric acid (FIG. 6B).

After the growth suppressing material layer 13 of $SiO_2$ is formed in the trough regions of the surface of the undercoat layer 12 in the aforementioned manner, the laminate of the substrate 11/ the undercoat layer 12/ the growth suppressing material layer 13 is returned to the MOCVD apparatus to grow group III nitride compound semiconductor layers.

Figure 6C:
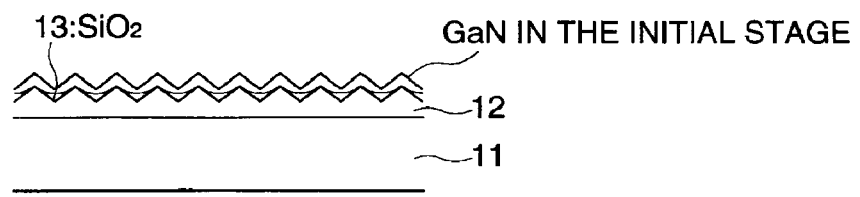
Figure 6D:
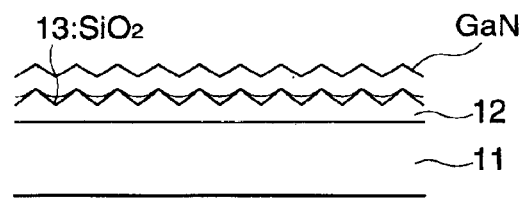
Figure 6E:
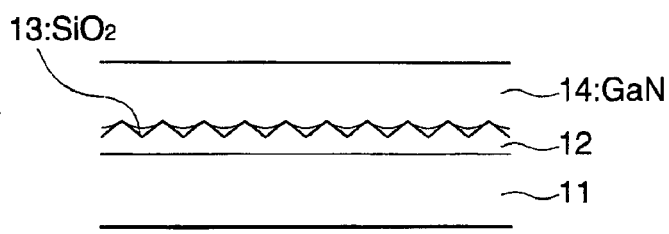

First, the substrate temperature is raised to 1130° C. and an n-type layer 14 is formed according to an ordinary method (MOCVD method). That is, an ammonia gas and gases of group III element alkyl compounds such as trimethylgallium (TMG), trimethylaluminum (TMA) and trimethylindium (TMI) are supplied to perform a heat decomposition reaction to thereby epitaxially grow n-type GaN. When n-type GaN is epitaxially grown in this manner, the n-type GaN layer (n-type layer 14) is not grown, or slowly grown even if it is grown, on the growth suppressing material layer 13 in an initial stage but rapid crystal growth occurs on the exposed portions (growth regions) of the undercoat layer 12. Thus, a facet structure is formed (FIG. 6C). When epitaxial growth is further performed, the growth advances in a direction perpendicular to the surface of the facet structure. Hence, the growth suppressing material layer is covered with the n-type GaN, so that the n-type GaN comes into contact with the n-type GaN grown on adjacent growth regions (FIG. 6D). When the epitaxial growth is further performed, the facet structure is buried so that the n-type layer 14 with a flat surface is obtained finally (FIG. 6E).

Then, the layer 15 and the p-type layer 16 are formed according to an ordinary method (MOCVD method).

Then, while Ti/Ni is used as a mask, the p-type layer 16, the layer 15 and the n-type layer 14 are partially removed by reactive ion etching to thereby expose a portion of the n-type layer 14 on which an n-type electrode pad 19 is to be formed.

A photo resist is applied on the semiconductor surface uniformly. The photo resist in the electrode-forming portion on the p-type layer 16 is removed by photolithography to thereby expose the p-type layer 16 in this portion. An Au—Co light-transmissible electrode layer 17 is formed on the exposed p-type layer 16.

Then, a p-type electrode pad 18 and an n-type electrode pad 19 are formed by vapor deposition in the same manner as described above.

Next, a second embodiment of the present invention will be described below.

Figure 7:
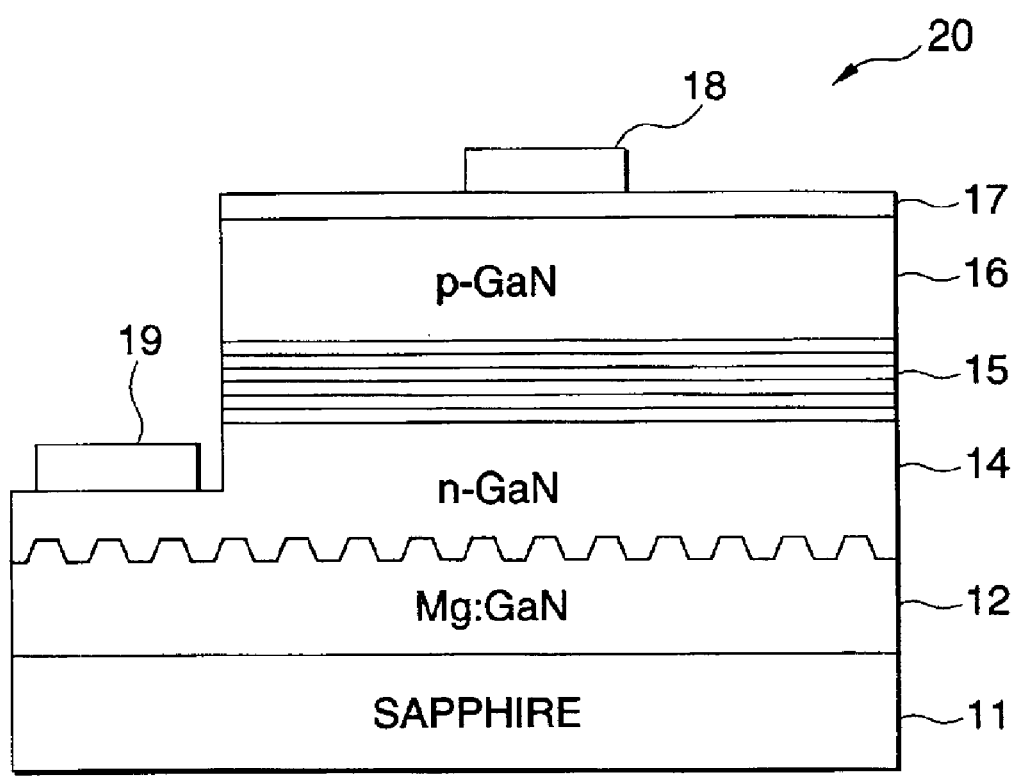
FIG. 7 shows a sectional view of a light-emitting diode according to a second embodiment of the present invention.

The embodiment shows a light-emitting diode 20. FIG. 7 shows the configuration of the light-emitting diode 20. In FIG. 7, parts the same as those in FIG. 5 are referenced correspondingly for the purpose of omission of duplicated description.

The specification of each layer is as follows.

| Layer | Composition: Dopant |
|---|---|
| Light-transmissible electrode layer 17 | p-GaN: Mg |
| p-type layer 16 | |
| Layer 15 including a light emitting layer | n-GaN: Si |
| n-type layer 14 | |
| Undercoat layer 12 | GaN: Mg |
| Substrate 11 | sapphire (surface a) |

The light-emitting diode configured as described above is produced as follows.

First, while a hydrogen gas is circulated in a reactor of an MOCVD apparatus, the sapphire substrate is heated to 1130° C. to thereby clean the surface of the sapphire substrate.

Figure 8:
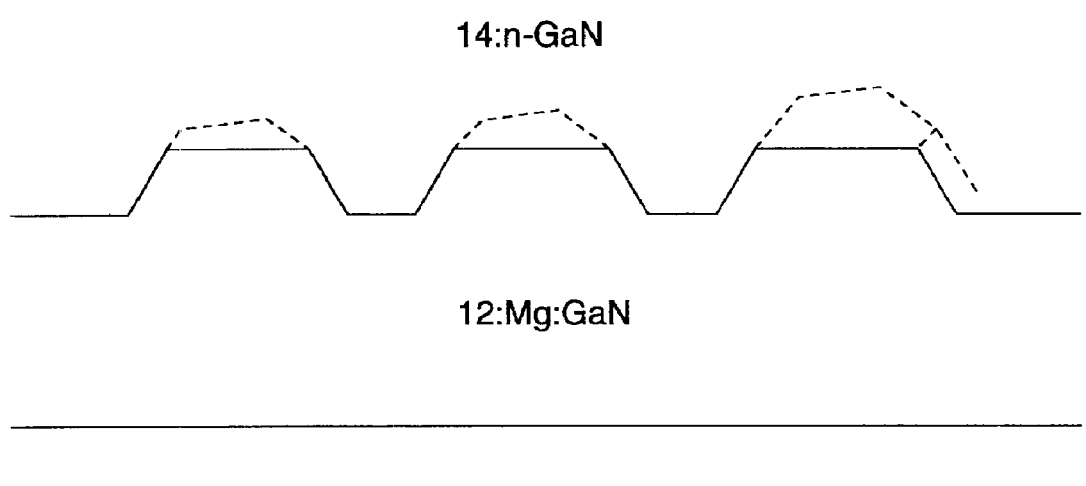
FIG. 8 shows a partly enlarged view showing the undercoat layer having convex portions each shaped like a truncated hexagonal pyramid.

Then, while TMG, $NH_3$ and $CP_2Mg$ are introduced at the substrate temperature, an undercoat layer 12 of GaN doped with Mg is grown by an MOCVD method. On this occasion, when the undercoat layer 12 of GaN is grown into a predetermined film thickness while TMG, $NH_3$ and $CP_2Mg$ are imported under the condition TMG: 47 μmol/min, $NH_3$: 10 SLM, $CP_2Mg$>3 μmol/min, the inside pressure of the reactor: atmospheric pressure, the surface of the GaN undercoat layer 12 has convex portions each shaped like a truncated hexagonal pyramid (see FIG. 8).

The reason why truncated-hexagonal-pyramid-shaped convex portions are formed is conceived to be due to the formation of Mg cores of growth from which GaN crystal is grown in the form of a hexagon with each Mg core as a starting point because a large amount of Mg is imported.

Then, while the substrate temperature and the inside pressure of the reactor are kept, an n-type layer 14 is formed and group III nitride compound semiconductor layers 15 and 16 are formed on the n-type layer 14 according to an ordinary method (MOCVD method). In this growth method, an ammonia gas and gases of group III element alkyl compounds such as trimethylgallium (TMG), trimethylaluminum (TMA) and trimethylindium (TMI) are supplied to a substrate heated to a suitable temperature to perform a heat decomposition reaction to thereby grow a desired crystal on the substrate.

Then, while Ti/Ni is used as a mask, the p-type layer 16, the layer 15 and the n-type layer 14 are partially removed by reactive ion etching to thereby expose a portion of the n-type layer 14 on which an n-type electrode pad 19 is to be formed.

A photo resist is applied on the semiconductor surface uniformly. The photo resist in the electrode-forming portion on the p-type layer 16 is removed by photolithography to thereby expose the p-type layer 16 in this portion. An Au—Co light-transmissible electrode layer 17 is formed on the exposed p-type layer 16.

Then, a p-type electrode pad 18 and an n-type electrode pad 19 are formed by vapor deposition in the same manner as described above.

Figure 9:
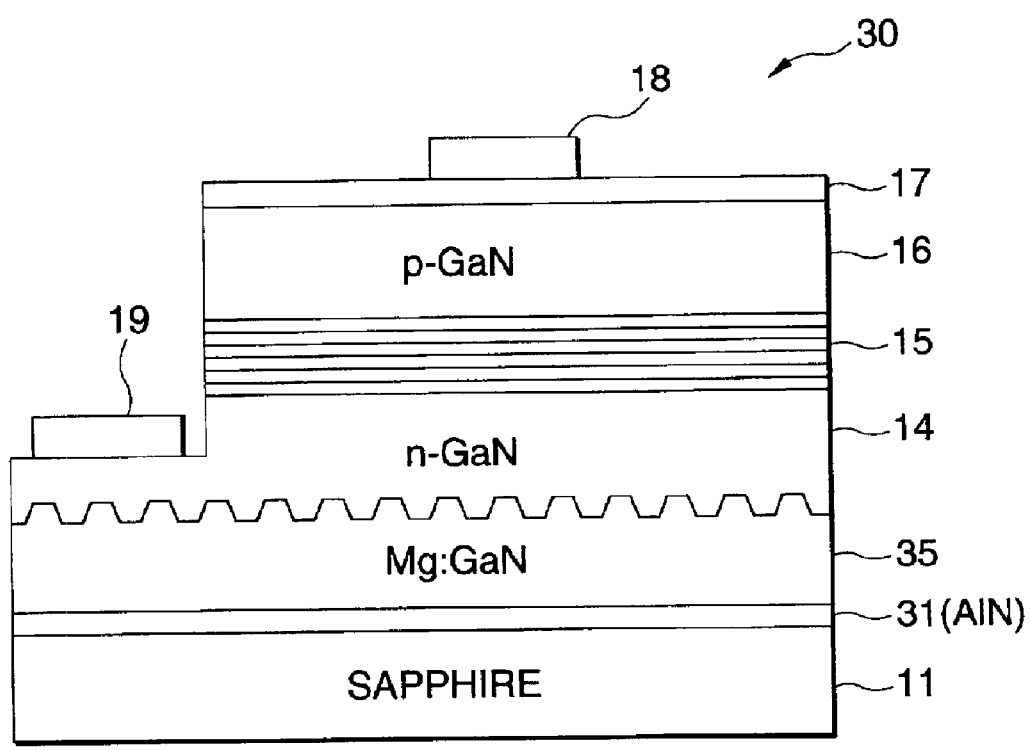
FIG. 9 shows a sectional view of a light-emitting diode according to a third embodiment of the present invention.

FIG. 9 shows a light-emitting diode 30 according to a third embodiment of the present invention. In FIG. 9, parts the same as those in FIGS. 5 and 7 are referenced correspondingly for the purpose of omission of duplicated description.

In the light-emitting diode 30 according to this embodiment, a sedimentary layer 31 of AlN is interposed between the sapphire substrate 11 and the undercoat layer 35.

The specification of each layer is as follows.

| Layer | Composition: Dopant |
|---|---|
| Light-transmissible electrode layer 17 | p-GaN: Mg |
| p-type layer 16 | |
| Layer 15 including a light emitting layer | n-GaN: Si |
| n-type layer 14 | |
| Undercoat layer 35 | GaN: Mg |
| Sedimentary layer 31 | AlN |
| Substrate 11 | sapphire (surface a) |

The light-emitting diode 30 configured as described above is produced as follows.

First, reactive sputtering using an aluminum target in a nitrogen gas import atmosphere is made at a sapphire substrate temperature in a range of from 300 to 500° C. by an argon gas sputtering apparatus. The sapphire substrate having AlN deposited thereon in the aforementioned manner is set in an MOCVD apparatus. While a hydrogen gas and an ammonia gas are circulated, the substrate is heated to 1130° C.

Layers after formation of the reflection layer 35 are formed in the same manner as shown in FIG. 7.

Although this specification has shown the case where a light-emitting device is used as an example, the present invention may be applied to various kinds of semiconductor devices. Examples of the device which can be used are electronic devices including optical devices such as a light-emitting diode, a photodetector, a laser diode, a solar cell, etc.; bipolar devices such as a rectifier, a thyristor, a transistor, etc.; unipolar devices such as an FET, etc.; and microwave devices. The present invention may be applied also to laminates that are intermediates of these devices.

Incidentally, a homo structure, a hetero structure or a double hetero structure may be used as the configuration of the light-emitting device. A quantum well structure (such as a single quantum well structure or a multiple quantum well structure) may be used as the structure of the light-emitting layer.

The present invention is not limited to the mode for carrying out the invention and the embodiment thereof at all, but includes various modifications that can be conceived easily by those skilled in the art, without departing from the scope of claim.

Finally, it is confirmed that the following items are disclosed in the present specification.

(1) A method for producing a group III nitride compound semiconductor device, comprising:

forming an undercoat layer on a substrate so that the undercoat layer has a plurality of slopes in its surface;

forming a growth suppressing material layer in trough regions each formed by adjacent ones of the slopes; and growing group III nitride compound semiconductor layers on the undercoat layer and on the growth suppressing material layer by executing an epitaxial lateral overgrowth method.

A method for producing a group III nitride compound semiconductor device according to the paragraph (1), wherein the surface of the undercoat layer has a texture structure.

A method for producing a group III nitride compound semiconductor device according to the paragraph (1), wherein the surface of the undercoat layer has a trapezoid shape in section.

A method for producing a group III nitride compound semiconductor device according to the paragraph (1), wherein the surface of the undercoat layer has a pit shape.

A method for producing a group III nitride compound semiconductor device according to the paragraph (1), wherein the percentage of the area occupied by the slopes in the surface of the undercoat layer is in a range of from 5 to 100% on a plane of projection.

A method for producing a group III nitride compound semiconductor device according to the paragraph (1), wherein the percentage of the area occupied by the slopes in the surface of the undercoat layer is in a range of from 30 to 100% on a plane of projection.

A method for producing a group III nitride compound semiconductor device according to the paragraph (1), wherein the percentage of the area occupied by the slopes in the surface of the undercoat layer is in a range of from 70 to 100% on a plane of projection.

A method for producing a group III nitride compound semiconductor device according to anyone of the above paragraphs (1), wherein forming the undercoat layer is performed under the condition of a temperature in a range of from 1000° C. to 1200° C.

A method for producing a group III nitride compound semiconductor device according to any one of the above paragraphs after (1), wherein the growth suppressing material layer is made of at least one member selected from the group consisting of Fe, Co, Ni, Cr, Mo, W, Ag, Rh, oxides of those members, $SiO_X$ and $SiN_X$.

A method for producing a group III nitride compound semiconductor device according to anyone of the above paragraphs after (1), wherein the undercoat layer is made of a group III nitride compound semiconductor. Hereupon, the substrate is made of sapphire and the undercoat layer is made of AlN. Further, the film thickness of the AlN layer is in a range of from 0.2 to 3.0 $\mu$m. Preferably, the film thickness of the AlN layer is in a range of from 0.5 to 1.5 $\mu$m.

A method for producing a group III nitride compound semiconductor device according to any one of the above paragraphs after (1), further comprising forming a sedimentary layer before forming the undercoat layer.

(2) A group III nitride compound semiconductor device comprising:
  a substrate;
  an undercoat layer formed on the substrate and having a surface of a texture structure;
  a growth suppressing material layer formed on the surface of the undercoat layer so that the surface of the undercoat layer is partially exposed; and
  group III nitride compound semiconductor layers formed on the exposed surface of the undercoat layer and on the growth suppressing material layer.

(3) A group III nitride compound semiconductor device comprising:
  a substrate;
  an undercoat layer formed on the substrate and having a surface with a trapezoid shape in section;
  a growth suppressing material layer formed on the surface of the undercoat layer so that the surface of the undercoat layer is partially exposed to the outside; and
  group III nitride compound semiconductor layers formed on the exposed surface of the undercoat layer and on the growth suppressing material layer.

(4) A group III nitride compound semiconductor device comprising:
  a substrate;
  an undercoat layer formed on the substrate and having a surface with a pit shape;
  a growth suppressing material layer formed on the surface of the undercoat layer so that the surface of the undercoat layer is partially exposed to the outside; and
  group III nitride compound semiconductor layers formed on the exposed surface of the undercoat layer and on the growth suppressing material layer.

A group III nitride compound semiconductor device according to any one of the paragraphs (2) through (4), wherein the growth suppressing material layer is made of at least one member selected from the group consisting of Fe, Co, Ni, Cr, Mo, W, Ag, Rh, oxides of those members, $SiO_X$ and $SiN_X$.

A group III nitride compound semiconductor device according to any one of the paragraphs (2) through (4), wherein the undercoat layer is made of a group III nitride compound semiconductor. Hereupon, the substrate is made of sapphire and the undercoat layer is made of AlN. The film thickness of the AlN layer is in a range of from 0.2 to 3.0 $\mu$m, preferably, in a range of from 0.5 to 1.5 $\mu$m.

A group III nitride compound semiconductor device according to any one of the paragraphs (2) through (4) and above, further comprising a sedimentary layer provided between the substrate and the undercoat layer.

(5) A group III nitride compound semiconductor device comprising:
  a substrate;
  an undercoat layer formed on the substrate and having a plurality of slopes in a surface of the undercoat layer;
  a growth suppressing material layer formed in trough regions each formed by adjacent ones of the slopes;
  group III nitride compound semiconductor layers formed on portions of the surface of the undercoat layer, where the growth suppressing material layer is not formed, and on the growth suppressing material layer.

A group III nitride compound semiconductor device according to the paragraph (5), wherein the surface of the undercoat layer has a texture structure.

A group III nitride compound semiconductor device according to the paragraph (5), wherein the surface of the undercoat layer has a trapezoid shape in section.

A group III nitride compound semiconductor device according to the paragraph (5), wherein the surface of the undercoat layer has a pit shape.

A group III nitride compound semiconductor device according to the paragraph (5), wherein the percentage of the area occupied by the slopes in the surface of the undercoat layer is in a range of from 5 to 100% on a plane of projection.

A group III nitride compound semiconductor device according to the paragraph (5), wherein the percentage of the area occupied by the slopes in the surface of the undercoat layer is in a range of from 30 to 100% on a plane of projection.

A group III nitride compound semiconductor device according to the paragraph (5), wherein the percentage of the area occupied by the slopes in the surface of the undercoat layer is in a range of from 70 to 100% on a plane of projection.

A group III nitride compound semiconductor device according to any one of the paragraphs (5) and thereafter, wherein the growth suppressing material layer is made of at least one member selected from the group consisting of Fe, Co, Ni, Cr, Mo, W, Ag, Rh, oxides of those members, $SiO_X$ and $SiN_X$.

A group III nitride compound semiconductor device according to any one of the paragraphs (5) and thereafter, wherein the undercoat layer is made of a group III nitride compound semiconductor. Hereupon, the substrate is made of sapphire and the undercoat layer is made of AlN. Further, the film thickness of the AlN layer is in a range of from 0.2 to 3.0 μm, preferably, in a range of from 0.5 to 1.5 μm.

A group III nitride compound semiconductor device according to any one of the paragraphs (5) and thereafter, further comprising a sedimentary layer provided between the substrate and the undercoat layer.

(6) A method for producing a laminate, comprising:
  forming an undercoat layer on a substrate so that the undercoat layer has a surface of a texture structure;
  forming a growth suppressing material layer on the undercoat layer so that the undercoat layer is partially exposed; and
  growing group III nitride compound semiconductor layers on the undercoat layer and on the growth suppressing material layer by executing an epitaxial lateral overgrowth method.

(7) A method for producing a laminate, comprising:
  forming an undercoat layer on a substrate so that the undercoat layer has a surface with a trapezoid shape in section;
  forming a growth suppressing material layer on the undercoat layer so that the undercoat layer is partially exposed to the outside; and
  growing group III nitride compound semiconductor layers on the undercoat layer and on the growth suppressing material layer by executing an epitaxial lateral overgrowth method.

(8) A method for producing a laminate, comprising:
  forming an undercoat layer on a substrate so that the undercoat layer has a surface with a pit shape;
  forming a growth suppressing material layer on the undercoat layer so that the undercoat layer is partially exposed; and
  growing group III nitride compound semiconductor layers on the undercoat layer and on the growth suppressing material layer by executing an epitaxial lateral overgrowth method.

A method for producing a laminate according to any one of the paragraphs (6) through (8), wherein forming the undercoat layer is performed under the condition of a temperature in a range of from 1000° C. to 1200° C.

A method for producing a laminate according to any one of the paragraphs (6) through (8) and just above, wherein the growth suppressing material layer is made of at least one member selected from the group consisting of Fe, Co, Ni, Cr, Mo, W, Ag, Rh, oxides of those members, $SiO_X$ and $SiN_X$.

A method for producing a laminate according to any one of the paragraphs (6) and thereafter, wherein the undercoat layer is made of a group III nitride compound semiconductor. Hereupon, the substrate is made of sapphire and the undercoat layer is made of AlN. Further, the film thickness of the AlN layer is in a range of from 0.2 to 3.0 μm, preferably, in a range of from 0.5 to 1.5 μm.

A method for producing a laminate according to any one of the paragraphs (6) and thereafter, further comprising forming a sedimentary layer before forming the undercoat layer.

(9) A method for producing a laminate, comprising:
  forming an undercoat layer on a substrate so that the undercoat layer has a plurality of slopes in its surface;
  forming a growth suppressing material layer in trough regions each formed by adjacent ones of the slopes; and
  growing group III nitride compound semiconductor layers on the undercoat layer and on the growth suppressing material layer by executing an epitaxial lateral overgrowth method.

A method for producing a laminate according to the paragraph (9), wherein the surface of the undercoat layer has a texture structure.

A method for producing a laminate according to the paragraph (9), wherein the surface of the undercoat layer has a trapezoid shape in section.

A method for producing a laminate according to the paragraph (9), wherein the surface of the undercoat layer has a pit shape.

A method for producing a laminate according to the paragraph (9), wherein the percentage of the area occupied by the slopes in the surface of the undercoat layer is in a range of from 5 to 100% on a plane of projection.

A method for producing a laminate according to the paragraph (9), wherein the percentage of the area occupied by the slopes in the surface of the undercoat layer is in a range of from 30 to 100% on a plane of projection.

A method for producing a laminate according to the paragraph (9), wherein the percentage of the area occupied by the slopes in the surface of the undercoat layer is in a range of from 70 to 100% on a plane of projection.

A method for producing a laminate according to any one of the paragraphs (9) and thereafter, wherein forming the undercoat layer is performed under the condition of a temperature in a range of from 1000° C. to 1200° C.

A method for producing a laminate according to any one of the paragraphs (9) and thereafter, wherein the growth suppressing material layer is made of at least one member selected from the group consisting of Fe, Co, Ni, Cr, Mo, W, Ag, Rh, oxides of those members, $SiO_X$ and $SiN_X$.

A method for producing a laminate according to any one of the paragraphs (9) and thereafter, wherein the undercoat layer is made of a group III nitride compound semiconductor. Hereupon, the substrate is made of sapphire and the undercoat layer is made of AlN. Further, the film thickness of the AlN layer is in a range of from 0.2 to 3.0 μm, preferably, in a range of from 0.5 to 1.5 μm.

A method for producing a laminate according to any one of the paragraphs (9) and thereafter, further comprising forming a sedimentary layer before forming the undercoat layer.

(10) A laminate comprising:
  a substrate;
  an undercoat layer formed on the substrate and having a surface of a texture structure;
  a growth suppressing material layer formed on the undercoat layer so that the surface of the undercoat layer is partially exposed; and
  group III nitride compound semiconductor layers formed on the exposed surface of the undercoat layer and on the growth suppressing material layer.

(11) A laminate comprising:
  a substrate;
  an undercoat layer formed on the substrate and having a surface with a trapezoid shape in section;
  a growth suppressing material layer formed on the surface of the undercoat layer so that the surface of the undercoat layer is partially exposed; and group III nitride compound semiconductor layers formed on the exposed surface of the undercoat layer and on the growth suppressing material layer.

(12) A laminate comprising:

a substrate;

an undercoat layer formed on the substrate and having a surface with a pit shape;

a growth suppressing material layer formed on the surface of the undercoat layer so that the surface of the undercoat layer is partially exposed; and group III nitride compound semiconductor layers formed on the exposed surface of the undercoat layer and on the growth suppressing material layer.

A laminate according to any one of the paragraphs (10) through (12), wherein the growth suppressing material layer is made of at least one member selected from the group consisting of Fe, Co, Ni, Cr, Mo, W, Ag, Rh, oxides of those members, $SiO_X$ and $SiN_X$.

A laminate according to any one of the paragraphs (10) and thereafter, wherein the undercoat layer is made of a group III nitride compound semiconductor. Hereupon, the substrate is made of sapphire and the undercoat layer is made of AlN. Further, the film thickness of the AlN layer is in a range of from 0.2 to 3.0 μm, preferably, in a range of from 0.5 to 1.5 μm.

A laminate according to any one of the paragraphs (10) and thereafter, further comprising a sedimentary layer provided between the substrate and the undercoat layer.

(13) A laminate comprising:

a substrate;

an undercoat layer formed on the substrate and having a plurality of slopes in a surface of the undercoat layer;

a growth suppressing material layer formed in trough regions each formed by adjacent ones of the slopes;

group III nitride compound semiconductor layers formed on portions of the surface of the undercoat layer, where the growth suppressing material layer is not formed, and on the growth suppressing material layer.

A laminate according to the paragraph (13), wherein the surface of the undercoat layer has a texture structure.

A laminate according to the paragraph (13), wherein the surface of the undercoat layer has a trapezoid shape in section.

A laminate according to the paragraph (13), wherein the surface of the undercoat layer has a pit shape.

A laminate according to the paragraph (13), wherein the percentage of the area occupied by the slopes in the surface of the undercoat layer is in a range of from 5 to 100% on a plane of projection.

A laminate according to the paragraph (13), wherein the percentage of the area occupied by the slopes in the surface of the undercoat layer is in a range of from 30 to 100% on a plane of projection.

A laminate according to the paragraph (13), wherein the percentage of the area occupied by the slopes in the surface of the undercoat layer is in a range of from 70 to 100% on a plane of projection.

A laminate according to any one of the paragraphs (13) and thereafter, wherein the growth suppressing material layer is made of at least one member selected from the group consisting of Fe, Co, Ni, Cr, Mo, W, Ag, Rh, oxides of those members, $SiO_X$ and $SiN_X$.

A laminate according to any one of the paragraphs (13) and thereafter, wherein the undercoat layer is made of a group III nitride compound semiconductor. Hereupon, the substrate is made of sapphire and the undercoat layer is made of AlN. Further, the film thickness of the AlN layer is in a range of from 0.2 to 3.0 μm, preferably, in a range of from 0.5 to 1.5 μm.

A laminate according to any one of the paragraphs (13) and thereafter, further comprising a sedimentary layer provided between the substrate and the undercoat layer.

(14) A group III nitride compound semiconductor device comprising a substrate, an undercoat layer formed on the substrate and having a surface of a texture structure, and group III nitride compound semiconductor layers which have a device function and which are formed on the undercoat layer by executing an epitaxial lateral overgrowth method.

(15) A group III nitride compound semiconductor device comprising a substrate, an undercoat layer formed on the substrate and having a surface with a trapezoid shape in section, and group III nitride compound semiconductor layers which have a device function and which are formed on the undercoat layer by executing an epitaxial lateral overgrowth method.

(16) A group III nitride compound semiconductor device comprising a substrate, an undercoat layer formed on the substrate and having a surface with a pit shape, and group III nitride compound semiconductor layers which have a device function and which are formed on the undercoat layer by executing an epitaxial lateral overgrowth method.

A group III nitride compound semiconductor device according to any one of the paragraphs (14) through (16), wherein the undercoat layer is formed under the condition of a temperature in a range of from 1000° C. to 1200° C.

A group III nitride compound semiconductor device according to any one of the paragraphs (14) and thereafter, wherein the undercoat layer is made of a group III nitride compound semiconductor. Hereupon, the substrate is made of sapphire and the undercoat layer is made of AlN. Further, the film thickness of the AlN layer is in a range of from 0.2 to 3.0 μm, preferably, in a range of from 0.5 to 1.5 μm.

(17) A method for producing a group III nitride compound semiconductor device, comprising:

forming an undercoat layer on a substrate so that the undercoat layer has a surface with convex portions each shaped like a truncated hexagonal pyramid; and forming group III nitride compound semiconductor layers on the undercoat layer so that the group III nitride compound semiconductor layers have a device function.

A method for producing a group III nitride compound semiconductor device according to the paragraph (17), wherein the undercoat layer is made of GaN doped with magnesium.

A method for producing a group III nitride compound semiconductor device according to the just above paragraph, wherein the magnesium concentration of the undercoat layer is not lower than $10^{20}/cm^3$.

A method for producing a group III nitride compound semiconductor device according to the paragraphs (17) and thereafter, wherein the undercoat layer is doped with an n-type dopant and is of an n type as a whole.

A method for producing a group III nitride compound semiconductor device according to any one of the paragraphs (17) and thereafter, wherein the substrate is made of sapphire, SiC or silicon single crystal.

A method for producing a group III nitride compound semiconductor device according to any one of the paragraphs (17) and thereafter, further comprising a sedimentary layer interposed between the undercoat layer and the substrate.

A method for producing a group III nitride compound semiconductor device according to any one of the paragraphs (17) and thereafter, wherein the group III nitride compound semiconductor layers have a function of a light-emitting device or of a photodetetor as a whole.

A method for producing a group III nitride compound semiconductor device according to any one of the paragraphs (17) and thereafter, wherein the undercoat layer and the group III nitride compound semiconductor layers are formed by the MOCVD method under the substantially same pressure condition.

(18) A laminate comprising:

a substrate;

an undercoat layer formed on the substrate and having a surface with convex portions each shaped like a truncated hexagonal pyramid; and group III nitride compound semiconductor layers formed successively on the undercoat layer.

A laminate according to the just above paragraph, wherein the undercoat layer is made of GaN doped with magnesium.

A laminate according to the just above paragraph, wherein the magnesium concentration of the undercoat layer is not lower than $10^{20}/cm^3$.

A laminate according to the paragraphs (18) and thereafter, wherein the undercoat layer is doped with an n-type dopant and is of an n type as a whole.

A laminate according to any one of the paragraphs (18) and thereafter, wherein the substrate is made of sapphire, SiC, or silicon single crystal.

A laminate according to any one of the paragraphs (18) and thereafter, further comprising a sedimentary layer interposed between the undercoat layer and the substrate.

A laminate according to any one of the paragraphs (18) and thereafter, wherein the group III nitride compound semiconductor layers have a function of a light-emitting device or of a photodetector as a whole.

(19) A method for producing a laminate, comprising the steps of:

forming an undercoat layer on a substrate so that the undercoat layer has a surface with convex portions each shaped like a truncated hexagonal pyramid; and forming group III nitride compound semiconductor layers on the undercoat layer.

A method for producing a laminate according to the just above paragraph, wherein the undercoat layer is made of GaN doped with magnesium.

A method for producing a laminate according to the just above paragraph, wherein the magnesium concentration of the undercoat layer is not lower than $10^{20}/cm^3$.

A method for producing a laminate according to the paragraphs (19) and thereafter, wherein the undercoat layer is doped with an n-type dopant and is of an n type as a whole.

A method for producing a laminate according to any one of the paragraphs (19) and thereafter, wherein the substrate is made of sapphire, SiC, or silicon single crystal.

A method for producing a laminate according to any one of the paragraphs (19) and thereafter, further comprising a sedimentary layer interposed between the undercoat layer and the substrate.

A method for producing a laminate according to any one of the paragraphs (19) and thereafter, wherein the group III nitride compound semiconductor layers have a function of a light-emitting device or of a photodetector as a whole.

(20) A group III nitride compound semiconductor device comprising: a substrate; a set of group III nitride compound semiconductor layers having a device function; and an undercoat layer disposed between the substrate and the set of group III nitride compound semiconductor layers, wherein the undercoat layer is grown so that the undercoat layer has a surface with convex portions each shaped like a truncated hexagonal pyramid.

A group III nitride compound semiconductor device according to the just above paragraph, wherein the undercoat layer is made of GaN doped with magnesium.

A group III nitride compound semiconductor device according to the just above paragraph, wherein the magnesium concentration of the undercoat layer is not lower than $10^{20}/cm^3$.

A group III nitride compound semiconductor device according to the paragraph (20) and thereafter, wherein the undercoat layer is doped with an n-type dopant and is of an n type as a whole.

A group III nitride compound semiconductor device according to any one of the paragraphs (20) and thereafter, wherein the substrate is made of sapphire, SiC, or silicon single crystal.

A group III nitride compound semiconductor device according to any one of the paragraphs (20) and thereafter, further comprising a sedimentary layer interposed between the undercoat layer and the substrate.

A group III nitride compound semiconductor device according to any one of the paragraphs (20) and thereafter, wherein the group III nitride compound semiconductor layers have a function of a light-emitting device or of a photodetector as a whole.

What is claimed is:

1. A group III nitride compound semiconductor device, comprising:

a substrate including an upper surface;

an undercoat layer formed on said upper surface of said substrate, said undercoat layer being doped with Mg to form convex portions in an upper surface of said undercoat layer, said convex portions comprising a shape of a truncated hexagonal pyramid; and a group III nitride compound semiconductor layers formed on said undercoat layer, wherein said undercoat layer comprises GaN which is further doped with an n-type dopant and is of an n-type as a whole.

2. A group III nitride compound semiconductor device according to claim 1, wherein a magnesium concentration of said undercoat layer is not lower than $10^{20}/cm^3$.

3. A group III nitride compound semiconductor device according to claim 1, wherein said substrate comprises one of sapphire, SiC, and silicon single crystal.

4. A group III nitride compound semiconductor device according to claim 1, further comprising;

a sedimentary layer interposed between said undercoat layer and said substrate.

5. A group III nitride compound semiconductor device according to claim 1, wherein said group III nitride compound semiconductor layers form one of a light-emitting device, a photodetector, and an electronic device as a whole.

6. A group III nitride compound semiconductor device according to claim 1, wherein said undercoat layer is formed on an entirety of said upper surface of said substrate.

7. A group III nitride compound semiconductor device according to claim 4, wherein said sedimentary layer comprises AlN.

8. A group III nitride compound semiconductor device according to claim 1, wherein said group III nitride compound semiconductor layers are separated from said substrate by said undercoat layer.

9. A group III nitride compound semiconductor device according to claim 8, wherein one of said group III nitride compound semiconductor layers comprises convex portions which are formed on said undercoat layer and between said convex portions of said undercoat layer.

10. A group III nitride compound semiconductor device according to claim 1, wherein said undercoat layer and one of the group III nitride compound semiconductor layers which is most adjacent to said undercoat layer comprise different materials.

11. A group III nitride compound semiconductor device according to claim 1, wherein said undercoat layer is formed directly on said upper surface of said substrate.

12. A group III nitride compound semiconductor device according to claim 1, wherein said undercoat layer is formed at a temperature in a range from 1000° C. to 1200° C.

13. A group III nitride compound semiconductor device according to claim 1, wherein said group III nitride compound semiconductor layers comprise an epitaxially-grown group III nitride compound semiconductor layer formed on said undercoat layer.

14. A group III nitride compound semiconductor device according to claim 1, wherein said group III nitride compound semiconductor layers comprise a group III nitride compound semiconductor layer formed directly on said undercoat layer having a thickness in a range from 1 $\mu$m to 2 $\mu$m.

15. A group III nitride compound semiconductor device according to claim 1, wherein said undercoat layer comprises a predetermined thickness for forming said convex portions to have said shape of said truncated hexagonal pyramid.

16. A group III nitride compound semiconductor device according to claim 1, wherein said undercoat layer is formed by a metal organic chemical vapor deposition (MOCVD) process using trimethylgallium gas, ammonia gas and $CP_2Mg$ gas, where CP represents $RC_5H_4$ in which R represents one of hydrogen and an alkyl group having 1 to 4 carbon atoms.

17. A group III nitride compound semiconductor device according to claim 16, wherein in said MOCVD process, a flow rate of said trimethylgallium gas comprises 47 $\mu$mol/min, a flow rate of said ammonia gas comprises 10 SLM and a flow rate of said $CP_2Mg$ gas comprises greater than 3 $\mu$mol/min.

18. A group III nitride compound semiconductor device according to claim 1, wherein said n-type dopant comprises silicon.

* * * * *